United States Patent
Wakabayashi (10) Patent No.: US 11,237,200 B2
(45) Date of Patent: Feb. 1, 2022

(54) AGING DEGRADATION DIAGNOSIS APPARATUS AND AGING DEGRADATION DIAGNOSIS METHOD

(71) Applicant: Mitsubishi Electric Corporation, Tokyo (JP)

(72) Inventor: Yuichi Wakabayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 133 days.

(21) Appl. No.: 16/616,870

(22) PCT Filed: Jun. 14, 2017

(86) PCT No.: PCT/JP2017/021963
§ 371 (c)(1),
(2) Date: Nov. 25, 2019

(87) PCT Pub. No.: WO2018/229897
PCT Pub. Date: Dec. 20, 2018

(65) Prior Publication Data
US 2021/0172992 A1 Jun. 10, 2021

(51) Int. Cl.
*G01R 31/12* (2020.01)
*G06K 9/62* (2006.01)

(52) U.S. Cl.
CPC ........... *G01R 31/12* (2013.01); *G06K 9/6212* (2013.01)

(58) Field of Classification Search
CPC ............................. G01R 31/12; G06K 9/6212
(Continued)

(56) References Cited

U.S. PATENT DOCUMENTS 6,088,658 A * 7/2000 Yazici ................ G01R 31/1272
702/180
6,445,189 B1 * 9/2002 Pakonen ................ G01R 31/52
324/536
(Continued)

FOREIGN PATENT DOCUMENTS

| CN | 101408579 A | 4/2009 |
|---|---|---|
| JP | 2001-133506 A | 5/2001 |
| JP | 2011-33538 A | 2/2011 |

OTHER PUBLICATIONS

Tsurimoto et al., "Development of Partial Discharge Monitor for Turbine Generators", IEEE, 1999, pp. 185-189.
(Continued)

*Primary Examiner* — Christopher P McAndrew
(74) *Attorney, Agent, or Firm* — Birch, Stewart, Kolasch & Birch, LLP (57) ABSTRACT

An apparatus includes: a degradation pattern generation unit for generating a degradation pattern indicating distributions of signal intensities of measured signals and a phase of an alternating voltage; a histogram calculation unit for calculating a gradient vector of a signal density at each of distribution points of the degradation pattern, and calculating, for each of phase ranges different from each other, from the calculated gradient vector, a histogram in a gradient direction of the signal density within the relevant phase range; a feature vector generation unit for generating a feature vector in which bin values of the histogram for each of the phase ranges are lined up; and a degradation cause identification unit for searching for, from among feature vectors by degradation cause, a feature vector similar to the feature vector generated by the feature vector generation unit, and outputting a degradation cause related to the similar feature vector.

7 Claims, 8 Drawing Sheets

(58) Field of Classification Search
USPC .......................................................... 324/551
See application file for complete search history.

(56) References Cited

U.S. PATENT DOCUMENTS

| | | | | |
|---|---|---|---|---|
| 6,507,181 | B1* | 1/2003 | Pakonen | G01R 31/12 |
| | | | | 324/536 |
| 7,076,404 | B2* | 7/2006 | Freisleben | G01R 31/1272 |
| | | | | 702/179 |
| 7,676,333 | B2* | 3/2010 | Younsi | G01R 31/1227 |
| | | | | 702/58 |
| 7,952,360 | B2* | 5/2011 | Ganesh | G01R 31/1272 |
| | | | | 324/536 |
| 8,143,899 | B2* | 3/2012 | Younsi | G01R 31/343 |
| | | | | 324/523 |
| 10,365,316 | B2* | 7/2019 | Sales Casals | G01R 31/1272 |
| 2008/0143315 | A1* | 6/2008 | Bickel | G01R 31/088 |
| | | | | 324/76.12 |
| 2009/0119035 | A1* | 5/2009 | Younsi | G01R 31/1227 |
| | | | | 702/58 |
| 2019/0064243 | A1* | 2/2019 | Codd | G01R 19/04 |

OTHER PUBLICATIONS

Chinese Office Action for Chinese Application No. 201780091542.6, dated May 7, 2021, with English translation.

Wang et al., "Digital Image Processing," University of Petroleum Press, Nov. 2016, pp. 120-121 (10 pages total), with partial English translation.

Wang et al., "Parallel Phase Resolved Partial Discharge Analysis for Pattern Recognition on Massive PD Data," Chinese Society for Electrical Engineering, Proceedings of the CSEE, vol. 36, No. 5, Mar. 5, 2016, pp. 1236-1244, with English abstract.

* cited by examiner

AGING DEGRADATION DIAGNOSIS APPARATUS AND AGING DEGRADATION DIAGNOSIS METHOD

TECHNICAL FIELD

The present invention relates to an aging degradation diagnosis apparatus and an aging degradation diagnosis method, each of which outputs a degradation cause of an apparatus.

BACKGROUND ART

There are needs for preventive maintenance of apparatuses in various fields including, for example, power plants, electric power apparatuses, railroad relevant apparatuses, and facilities of a factory line. Preventive maintenance technologies, including a technology for detecting degradation of an apparatus, a technology for identifying a degradation occurrence cause or a degradation occurrence point, and a technology for predicting failure time, are being studied.

In an apparatus that generates a high voltage, such as a turbine generator or a gas-insulation apparatus, insulation degradation of insulators used inside the apparatus progresses as a result of long-term use, and finally causes dielectric breakdown. Therefore, preventive maintenance technologies are being studied for the purpose of, for example, improving an operating rate of an apparatus.

As an apparatus for identifying a degradation occurrence cause or a degradation occurrence point, Patent Literature 1 mentioned below discloses an aging degradation diagnosis apparatus that determines a degradation cause by using a phase signal indicating a phase of an alternating voltage applied to an apparatus to be diagnosed, and a measured signal of a sensor that is measuring a degradation state of the apparatus.

This aging degradation diagnosis apparatus prepares beforehand a neural network that learns a degradation cause determination model, and determines a degradation cause by giving a phase signal indicating a phase of an alternating voltage, and a measured signal of the sensor to the neural network. Hereinafter, each of the phase signal and the measured signal is referred to as "input signal".

CITATION LIST

Patent Literatures

Patent Literature 1: JP 2001-133506 A

SUMMARY OF INVENTION

Technical Problem

The aging degradation diagnosis apparatus in the prior art is configured as described above, and therefore accuracy of determining a degradation cause depends on accuracy of learning a degradation cause determination model. Therefore, the accuracy of determining a degradation cause increases with the increase in accuracy of learning a degradation cause determination model. However, in order to increase the accuracy of learning a degradation cause determination model, it is necessary to give a large number of input signals to a neural network.

Since degradation of an apparatus gradually progresses over a long period of time, it is difficult to give a large number of input signals to a neural network for each degradation cause, and therefore there is a case where the accuracy of learning a degradation cause determination model cannot be increased. Accordingly, there arises a problem that there is a case where a correct degradation cause cannot be determined.

The present invention has been made to solve a problem such as that described above, and an object of the present invention is to obtain an aging degradation diagnosis apparatus and an aging degradation diagnosis method, each of which can identify a degradation cause of an apparatus without preparing beforehand a neural network that learns a degradation cause determination model.

Solution to Problem

An aging degradation diagnosis apparatus according to the present invention includes: a degradation pattern generation unit for generating, from phase signals obtained at a plurality of times, the phase signals indicating a phase of an alternating voltage applied to an apparatus to be diagnosed, and from measured signals measured at a plurality of times by a sensor that is measuring a degradation state of the apparatus, a degradation pattern indicating a distribution of signal intensities of the measured signals and the phase of the alternating voltage; a histogram calculation unit for calculating a gradient vector of a signal density at each of distribution points of the degradation pattern generated by the degradation pattern generation unit, and calculating, for each of phase ranges different from each other, from the calculated gradient vector, a histogram in a gradient direction of the signal density within the relevant phase range; and a feature vector generation unit for generating a feature vector in which bin values of the histogram for each of the phase ranges calculated by the histogram calculation unit are lined up, wherein from among feature vectors by degradation cause, a degradation cause identification unit searches for a feature vector similar to the feature vector generated by the feature vector generation unit, and identifies a degradation cause of the apparatus.

Advantageous Effects of Invention

According to the present invention, since the aging degradation diagnosis apparatus includes: a degradation pattern generation unit for generating a degradation pattern indicating distributions of signal intensities of the measured signals and the phases of the alternating voltage; a histogram calculation unit for calculating a gradient vector of a signal density at each distribution point of the degradation pattern, and calculating, for each of phase ranges different from each other, from the calculated gradient vector, a histogram in a gradient direction of the signal density within the relevant phase range; and a feature vector generation unit for generating a feature vector in which bin values of the histogram in each of the phase ranges are lined up, wherein from among feature vectors by degradation cause, a degradation cause identification unit searches for a feature vector similar to the feature vector generated by the feature vector generation unit, and identifies a degradation cause of the apparatus. Such a configuration produces an effect to identify a degradation cause of the apparatus without preparing beforehand a neural network that learns a degradation cause determination model.

BRIEF DESCRIPTION OF DRAWINGS

FIG. 3 is a hardware configuration diagram of a computer used in a case where an aging degradation diagnosis apparatus is implemented by software, firmware or the like.

FIG. 4 is a flowchart illustrating an aging degradation diagnosis method based on processing procedures used in a case where the aging degradation diagnosis apparatus is implemented by software, firmware or the like.

DESCRIPTION OF EMBODIMENTS

In order to describe the present invention in further detail, embodiments of the present invention will be described below according to the accompanying drawings.

First Embodiment

Figure 1:
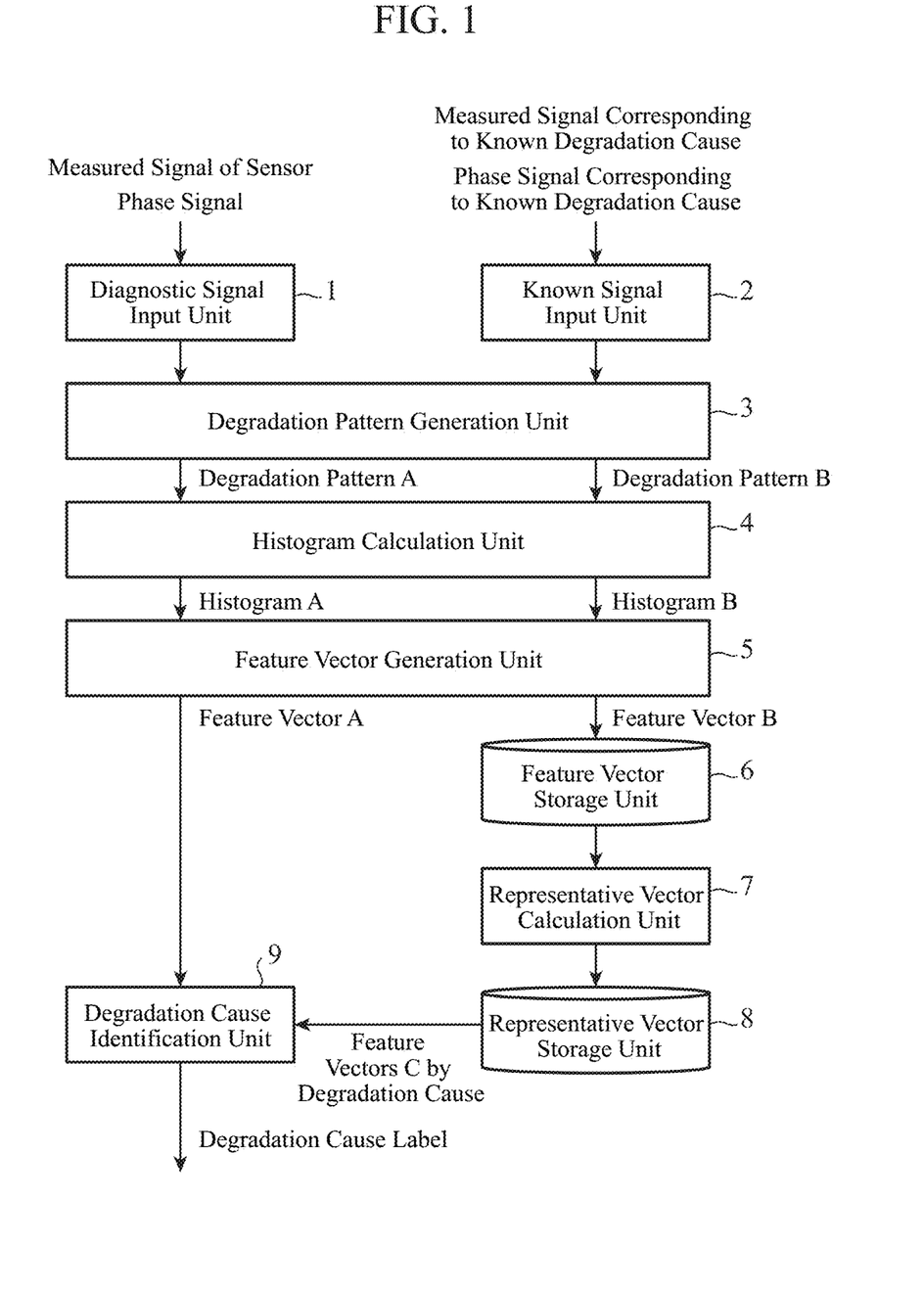
FIG. 1 is a configuration diagram illustrating an aging degradation diagnosis apparatus according to a first embodiment of the present invention.
Figure 2:
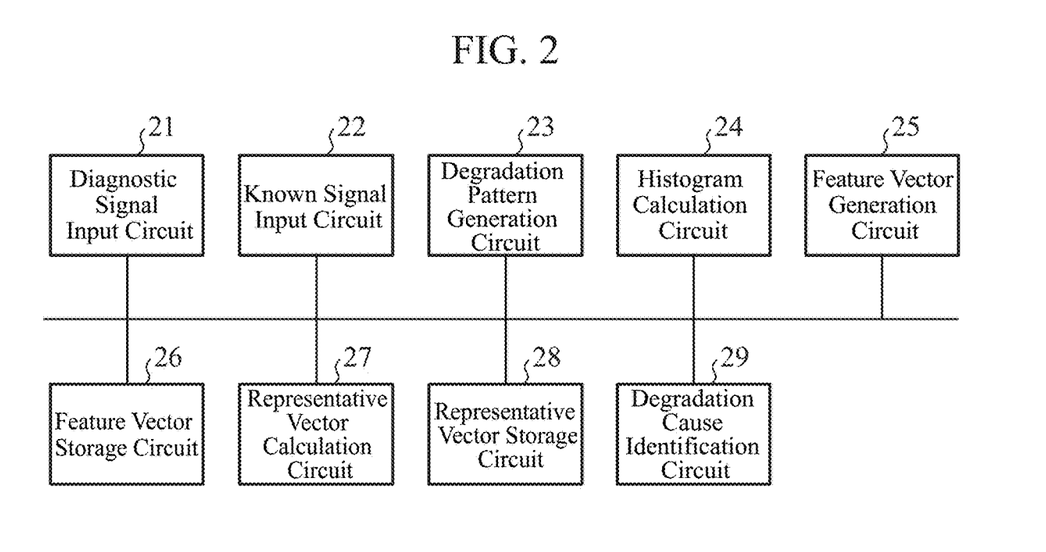
FIG. 2 is a hardware configuration diagram illustrating the aging degradation diagnosis apparatus according to the first embodiment of the present invention.

FIG. 1 is a configuration diagram illustrating an aging degradation diagnosis apparatus according to the first embodiment of the present invention. FIG. 2 is a hardware configuration diagram illustrating the aging degradation diagnosis apparatus according to the first embodiment of the present invention.

In FIGS. 1 and 2, a diagnostic signal input unit 1 is implemented by a diagnostic signal input circuit 21 shown in, for example, FIG. 2.

The diagnostic signal input unit 1 receives phase signals obtained at a plurality of times, the phase signals indicating phases of the alternating voltage applied to an apparatus to be diagnosed, and measured signals obtained at a plurality of times by a sensor that is measuring a degradation state of the apparatus to be diagnosed, and outputs the phase signals obtained at the plurality of times, and the measured signals obtained at the plurality of times, to the degradation pattern generation unit 3.

A known signal input unit 2 is implemented by a known signal input circuit 22 shown in, for example, FIG. 2.

The known signal input unit 2 receives phase signals obtained at the plurality of times corresponding to a known degradation cause, and measured signals obtained at the plurality of times corresponding to the known degradation cause, and outputs the phase signals obtained at the plurality of times, and the measured signals obtained at the plurality of times, to the degradation pattern generation unit 3.

A degradation cause label indicating a degradation cause is added to each of the phase signals and the measured signals input by the known signal input unit 2.

The degradation pattern generation unit 3 is implemented by a degradation pattern generation circuit 23 shown in, for example, FIG. 2.

The degradation pattern generation unit 3 collects the phase signals obtained at the plurality of times and the measured signals obtained at the plurality of times, the phase signals and the measured signals output from the diagnostic signal input unit 1.

The degradation pattern generation unit 3 performs a process of generating a degradation pattern A indicating distributions of signal intensities of measured signals and phases of the alternating voltage from the collected phase signals obtained at the plurality of times, and the collected measured signals obtained at the plurality of times.

In addition, the degradation pattern generation unit 3 collects the phase signals obtained at the plurality of times and attached with the degradation cause labels, and the measured signals attached with the degradation cause labels, the phase signals and the measured signals output from the known signal input unit 2.

The degradation pattern generation unit 3 performs a process of generating a degradation pattern B indicating distributions of signal intensities of measured signals and phases of the alternating voltage from the collected phase signals obtained at the plurality of times, which have been attached with the degradation cause labels, and the collected measured signals obtained at the plurality of times, which have been attached with the degradation cause labels.

A degradation cause label indicating a degradation cause is added to the degradation pattern B generated by the degradation pattern generation unit 3.

The histogram calculation unit 4 is implemented by a histogram calculation circuit 24 shown in, for example, FIG. 2.

The histogram calculation unit 4 performs a process of calculating a gradient vector of the signal density at each distribution point in the degradation pattern A generated by the degradation pattern generation unit 3, and for each of segments that are phase ranges different from each other, calculating, from the calculated gradient vectors, a histogram A in the gradient direction of the signal densities in the segment.

In addition, the histogram calculation unit 4 performs a process of calculating a gradient vector of the signal density at each distribution point in the degradation pattern B generated by the degradation pattern generation unit 3, and for each of segments that are phase ranges different from each other, calculating, from the calculated gradient vectors, a histogram B in the gradient direction of the signal densities in the segment.

A degradation cause label indicating a degradation cause is added to the histogram B in each segment calculated by the histogram calculation unit 4.

The feature vector generation unit 5 is implemented by a feature vector generation circuit 25 shown in, for example, FIG. 2.

The feature vector generation unit 5 performs a process of generating the feature vector A in which bin values of the histogram A for each segment calculated by the histogram calculation unit 4 are lined up.

In addition, the feature vector generation unit 5 performs a process of generating the feature vector B in which bin values of the histogram B for each segment calculated by the histogram calculation unit 4 are lined up.

A degradation cause label indicating a degradation cause is added to the feature vector B generated by the feature vector generation unit 5.

A feature vector storage unit 6 is implemented by a feature vector storage circuit 26 shown in, for example, FIG. 2.

As a feature vector, the degradation cause of which is known, the feature vector storage unit 6 stores the feature vector B generated by the feature vector generation unit 5.

A representative vector calculation unit 7 is implemented by a representative vector calculation circuit 27 shown in, for example, FIG. 2.

The representative vector calculation unit 7 performs a process of collecting, from among the feature vectors B stored in the feature vector storage unit 6, a plurality of feature vectors B each having the same degradation cause, and calculating a representative vector of the degradation cause from the plurality of collected feature vectors B.

A representative vector storage unit 8 is implemented by a representative vector storage circuit 28 shown in, for example, FIG. 2.

The representative vector storage unit 8 stores the feature vectors calculated by the representative vector calculation unit 7 as feature vectors C by degradation cause.

A degradation cause identification unit 9 is implemented by a degradation cause identification circuit 29 shown in, for example, FIG. 2.

The degradation cause identification unit 9 performs a process of identifying a degradation cause of an apparatus by searching for a feature vector C similar to the feature vector A generated by the feature vector generation unit 5 from among the feature vectors C by degradation cause stored in the representative vector storage unit 8.

The degradation cause identification unit 9 performs a process of outputting, as a result of identifying a degradation cause of the apparatus, a degradation cause label added to the identified feature vector C.

In FIG. 1, it is assumed that the diagnostic signal input unit 1, the known signal input unit 2, the degradation pattern generation unit 3, the histogram calculation unit 4, the feature vector generation unit 5, the feature vector storage unit 6, the representative vector calculation unit 7, the representative vector storage unit 8 and the degradation cause identification unit 9, which are components of the aging degradation diagnosis apparatus, are each implemented by dedicated hardware such as that shown in FIG. 2. In other words, it is assumed that the components of the aging degradation diagnosis apparatus are implemented by the diagnostic signal input circuit 21, the known signal input circuit 22, the degradation pattern generation circuit 23, the histogram calculation circuit 24, the feature vector generation circuit 25, the feature vector storage circuit 26, the representative vector calculation circuit 27, the representative vector storage circuit 28 and the degradation cause identification circuit 29.

Here, for example, a non-volatile or volatile semiconductor memory such as a random access memory (RAM), a read only memory (ROM), a flash memory, an erasable programmable read only memory (EPROM) and an electrically erasable programmable read-only memory (EEPROM), and also a magnetic disk, a flexible disk, an optical disk, a compact disk, a MiniDisk, and a digital versatile disc (DVD), are applicable to the feature vector storage circuit 26 and the representative vector storage circuit 28.

In addition, for example, a single circuit, a composite circuit, a programmed processor, a parallel-programmed processor, an application specific integrated circuit (ASIC), a field-programmable gate array (FPGA), or a combination of these components, are applicable to the diagnostic signal input circuit 21, the known signal input circuit 22, the degradation pattern generation circuit 23, the histogram calculation circuit 24, the feature vector generation circuit 25, the representative vector calculation circuit 27 and the degradation cause identification circuit 29.

The components of the aging degradation diagnosis apparatus are not limited to those implemented by dedicated hardware. The aging degradation diagnosis apparatus may be implemented by software, firmware or a combination of software and firmware.

Software or firmware is stored in a memory of a computer as a program. The computer means hardware that executes a program. For example, a central processing unit (CPU), a central processing unit, a processing unit, a computation device, a microprocessor, a microcomputer, a processor, a digital signal processor (DSP) or the like is applicable to the computer.

Figure 3:
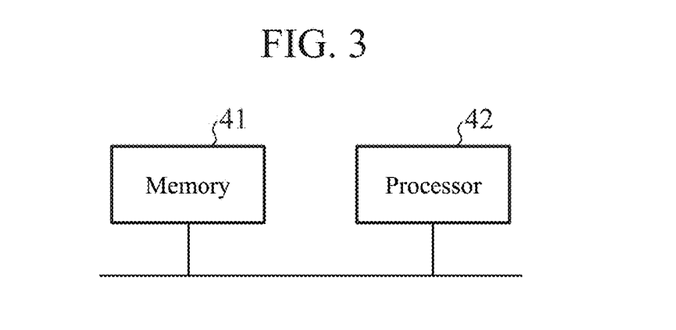

FIG. 3 is a hardware configuration diagram of a computer used in a case where the aging degradation diagnosis apparatus is implemented by software, firmware or the like.

In a case where the aging degradation diagnosis apparatus is implemented by software, firmware or the like, the feature vector storage unit 6 and the representative vector storage unit 8 are formed on a memory 41 of the computer, a program that causes the computer to execute processing procedures of the diagnostic signal input unit 1, the known signal input unit 2, the degradation pattern generation unit 3, the histogram calculation unit 4, the feature vector generation unit 5, the representative vector calculation unit 7 and the degradation cause identification unit 9 is stored in the memory 41, and a processor 42 of the computer has only to be caused to execute the program stored in the memory 41.

Figure 4:
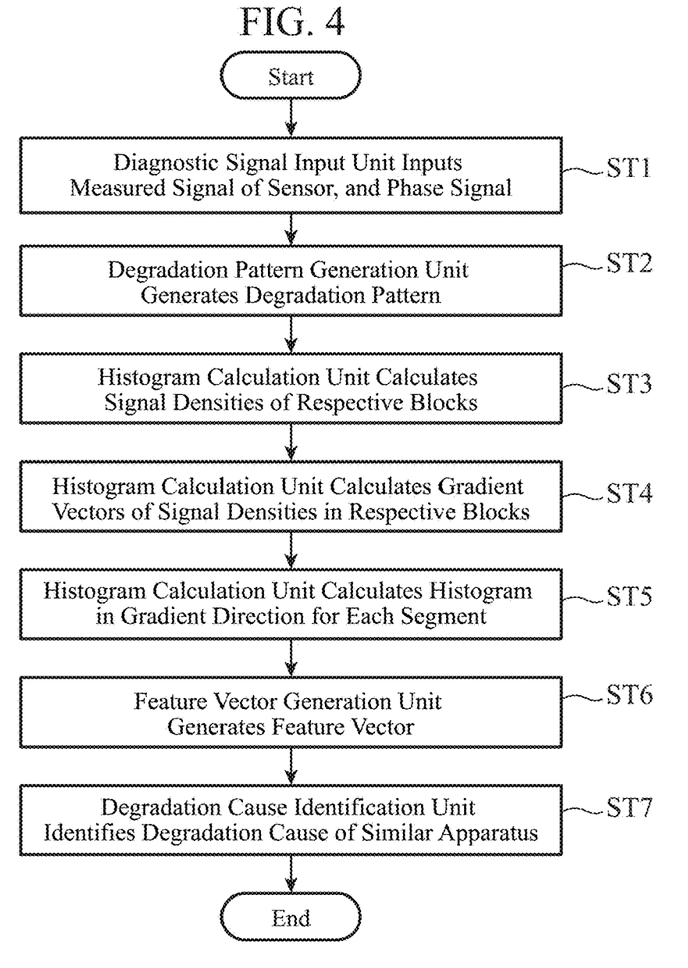

FIG. 4 is a flowchart illustrating an aging degradation diagnosis method based on processing procedures used in a case where the aging degradation diagnosis apparatus is implemented by software, firmware or the like.

In addition, FIG. 2 shows an example in which the components of the aging degradation diagnosis apparatus are each implemented by dedicated hardware, and FIG. 3 shows an example in which the aging degradation diagnosis apparatus is implemented by software, firmware or the like. However, while a part of the components of the aging degradation diagnosis apparatus is implemented by dedicated hardware, remaining components may be implemented by software, firmware or the like.

Next, operation will be described.

A sensor measures, at fixed time intervals T, a degradation state of an apparatus to be diagnosed, and outputs, to the diagnostic signal input unit 1, measured signals indicating the degradation state of the apparatus.

In a case where high-speed processing is required, for example, in a case where a degradation state of an apparatus is diagnosed online, intervals of approximately several seconds are considered to be the fixed time intervals T.

In addition, for example, in a case where a degradation state of an apparatus is diagnosed offline, or in a case where high-accuracy diagnosis is required, long time intervals of approximately several tens of seconds to several minutes are considered to be the fixed time intervals T.

For example, in a case where the apparatus to be diagnosed is a high voltage power apparatus, with the progress of insulation degradation, a discharge phenomenon that is called partial discharge occurs inside the high voltage power apparatus.

It is known that a phase characteristic of partial discharge shows a characteristic pattern depending on a degradation occurrence cause. Accordingly, using this discharge pattern enables to identify a degradation cause, or a discharge occurrence point, of the high voltage power apparatus.

Therefore, in a case where the apparatus to be diagnosed is a high voltage power apparatus, it is possible to consider a mode in which a sensor measures partial discharge occurring inside the high voltage power apparatus.

When degradation of an apparatus is diagnosed, the diagnostic signal input unit 1 receives measured signals obtained at the plurality of times, the measured signals measured at fixed time intervals T by the sensor (step ST1 of FIG. 4).

In addition, the diagnostic signal input unit 1 receives phase signals obtained at the plurality of times, the phase signals indicating phases of the alternating voltage applied to the apparatus to be diagnosed (step ST1 of FIG. 4).

The diagnostic signal input unit 1 outputs each of the measured signals obtained at the plurality of times, and each of the phase signals obtained at the plurality of times, to the degradation pattern generation unit 3.

The degradation pattern generation unit 3 collects the phase signals obtained at the plurality of times and the measured signals obtained at the plurality of times, the phase signals and the measured signals output from the diagnostic signal input unit 1.

The degradation pattern generation unit 3 generates a degradation pattern A indicating distributions of signal intensities of measured signals and phases of the alternating voltage from the collected phase signals obtained at the plurality of times, and the collected measured signals obtained at the plurality of times (step ST2 of FIG. 4).

A process of generating the degradation pattern A by the degradation pattern generation unit 3 will be specifically described below.

Figure 5:
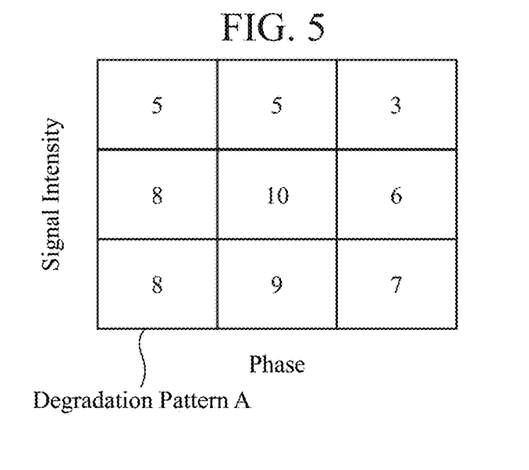
FIG. 5 is an explanatory drawing illustrating a degradation pattern A to be generated by a degradation pattern generation unit 3.

FIG. 5 is an explanatory drawing illustrating the degradation pattern A generated by the degradation pattern generation unit 3.

As shown in FIG. 5, the degradation pattern generation unit 3 partitions a plane in which the horizontal axis that is a first axis is a phase of the alternating voltage, and in which the vertical axis that is a second axis is signal intensity of a measured signal, into pieces that form a mesh pattern, thereby dividing the plane into a plurality of blocks at equal intervals.

FIG. 5 shows an example in which the plane is divided into 3×3 blocks. However, for example, in a case where the measurement time required for phase signals and measured signals is long, with the result that the number of signal points is large, or in a case where a high-accuracy diagnosis is required, it is possible to consider a mode in which the number of divided blocks is increased.

For example, in a case where the measurement time required for phase signals and measured signals is short, with the result that the number of signal points is small, or in a case where online high-speed processing is required, it is possible to consider a mode in which the number of divided blocks is decreased.

The degradation pattern generation unit 3 refers to a phase indicated by a phase signal at each time, and signal intensity of a measured signal at each time, and identifies a block to which a set of the phase signal and the measured signal at each time belongs.

For example, in a case where 100 sets of signals are obtained from the diagnostic signal input unit 1 as a set of a phase signal and a measured signal at each time, the degradation pattern generation unit 3 identifies respective blocks to which the 100 sets of signals belong.

FIG. 5 indicates that, for example, seven sets of signals belong to the lower right block, and three sets of signals belong to the upper right block, in the figure.

The degradation pattern generation unit 3 generates, as a degradation pattern A, a pattern indicating the number of sets of the phase signal and the measured signal that belong to each divided block, and outputs the degradation pattern A to the histogram calculation unit 4.

The histogram calculation unit 4 calculates signal densities at respective distribution points that are blocks included in the degradation pattern A output from the degradation pattern generation unit 3 (step ST3 of FIG. 4).

The signal density of a block can be determined by dividing, for example, the number of sets of signals belonging to the block by the number of sets of signals belonging to all blocks, and then by multiplying a result of the division by a preset constant M.

For example, if the constant M is 100, the number of sets of signals belonging to all blocks is 50, and the number of sets of signals belonging to a certain block is 8, the signal density of the certain block is 16 (=(8/50)×100).

Here, an example in which the number of sets of signals belonging to the block is divided by the number of sets of signals belonging to all blocks is shown. However, the present invention is not limited to this.

For example, the signal density of a block may be determined by excluding, from sets of signals belonging to all blocks, sets of signals in which the signal intensity of the measured signal is 0, by dividing the number of sets of signals belonging to the block by the number of remaining sets of signals, and then by multiplying a result of the division by the constant M.

Figure 6:
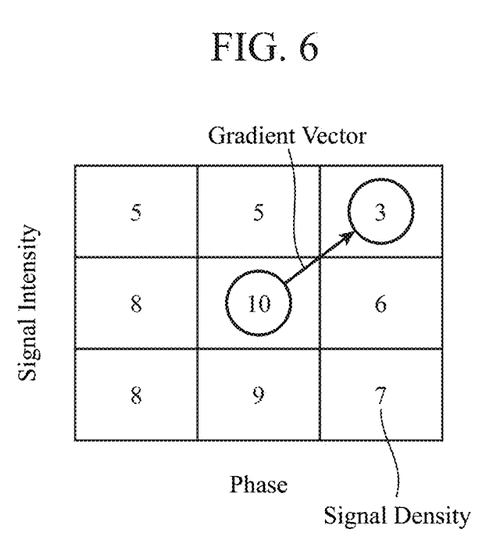
FIG. 6 is an explanatory drawing illustrating a gradient vector of a signal density at each distribution point in the degradation pattern A to be calculated by a histogram calculation unit 4.

FIG. 6 is an explanatory drawing illustrating a gradient vector of a signal density at each distribution point in the degradation pattern A calculated by the histogram calculation unit 4.

In the example shown in FIG. 6, numerical values in respective blocks are the same as those in the respective blocks in FIG. 5. However, the numerical values in the respective blocks shown in FIG. 6 indicate signal densities, and the numerical values in the respective blocks shown in FIG. 5 indicate the number of sets of signals belonging thereto. Therefore, in actuality, the numerical values in the respective blocks shown in FIG. 6 differ from the numerical values in the respective blocks shown in FIG. 5.

Next, the histogram calculation unit 4 calculates gradient vectors of the signal densities in the respective blocks (step ST4 of FIG. 4).

A calculation process of calculating gradient vectors by the histogram calculation unit 4 will be specifically described below.

The histogram calculation unit 4 calculates, for each divided block, a difference between the signal density of the block and each of signal densities of a plurality of blocks adjacent to the block.

For example, in FIG. 6, when attention is focused on the central block, the signal density of which is 10, a difference between the signal density of this attention-focused block and each of signal densities of eight blocks adjacent to the attention-focused block is calculated.

In the example shown in FIG. 6, a difference between the signal density of the attention-focused block and the signal density of the upper left block is 5, a difference between the signal density of the attention-focused block and the signal density of the left side block is 2, and a difference between the signal density of the attention-focused block and the signal density of the lower left block is 2.

In addition, a difference between the signal density of the attention-focused block and the signal density of the upper block is 5, and a difference between the signal density of the attention-focused block and the signal density of the lower block is 1.

Further, a difference between the signal density of the attention-focused block and the signal density of the upper right block is 7, a difference between the signal density of the attention-focused block and the signal density of the right side block is 4, and a difference between the signal density of the attention-focused block and the signal density of the lower right block is 3.

By comparing the calculated differences thereamong, the histogram calculation unit 4 identifies, from among the plurality of adjacent blocks, a block having a signal density, the difference from the signal density of the attention-focused block of which is the largest.

The histogram calculation unit 4 determines a vector indicating a direction starting from the attention-focused block toward the identified block as a gradient vector in the attention-focused block.

In the example shown in FIG. 6, the gradient vector in the attention-focused block indicates a direction starting from the attention-focused block toward the upper right block.

The histogram calculation unit 4 calculates gradient vectors of the signal densities in the respective blocks. Subsequently, as shown in FIG. 7, from the gradient vectors in the respective blocks, for each of segments that are phase ranges different from each other, the histogram calculation unit 4 calculates a histogram A in the gradient direction of the signal density in the segment (step ST5 of FIG. 4).

The histogram calculation unit 4 outputs the histogram A calculated on a segment basis to the feature vector generation unit 5.

Figure 7:
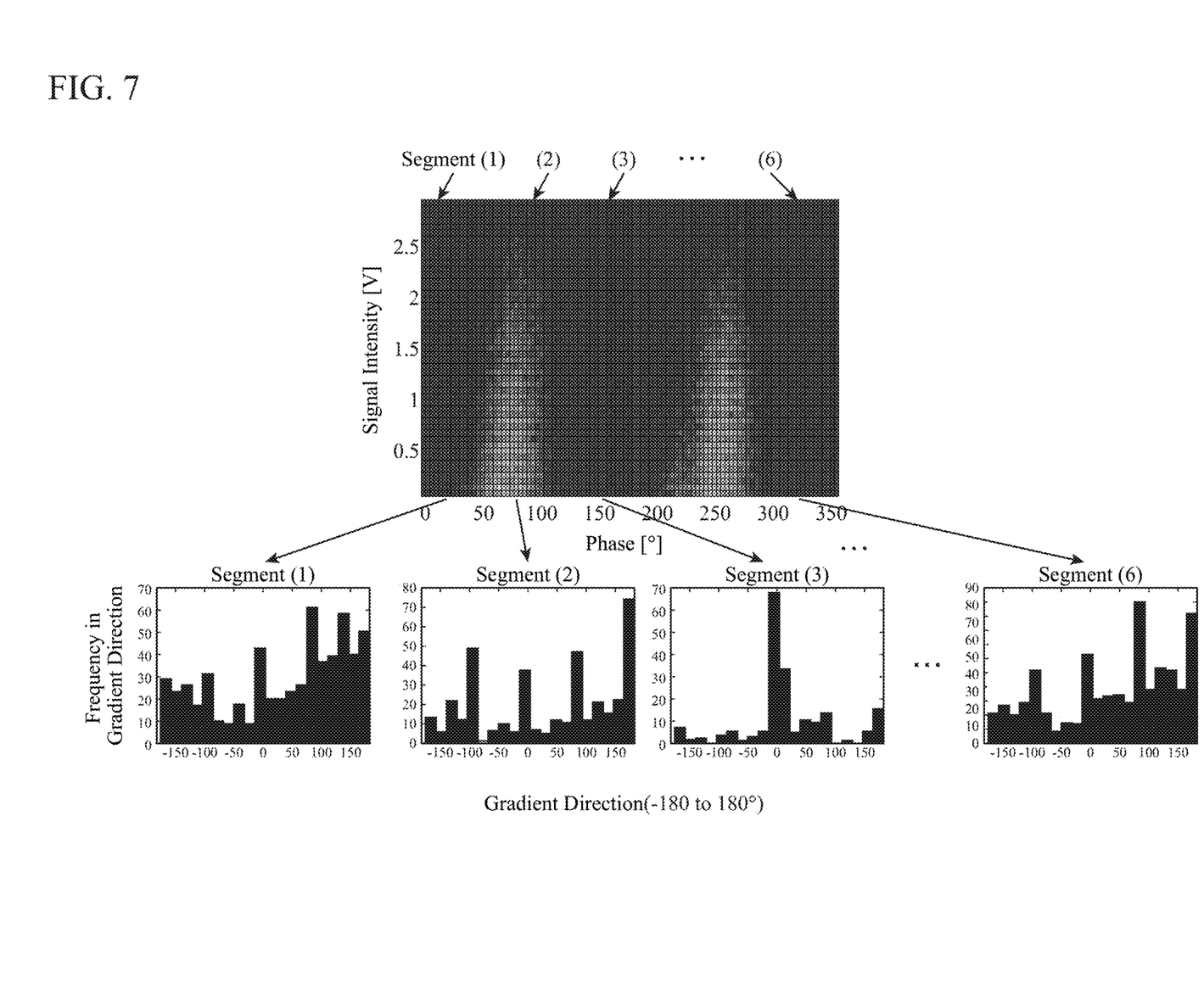
FIG. 7 is an explanatory drawing illustrating a histogram A for each segment to be calculated by the histogram calculation unit 4.

FIG. 7 is an explanatory drawing illustrating a histogram A for each segment calculated by the histogram calculation unit 4.

In the example shown in FIG. 7, a plane having a plurality of blocks is divided into six segments in a phase direction.

Therefore, a histogram A in a gradient direction of the signal density is calculated for each of six segments.

The histogram A in the gradient direction is a frequency of gradient directions indicated by gradient vectors in respective blocks included in the segment.

FIG. 7 shows the frequency in a gradient direction of −180 to 180 degrees.

If the alternating voltage applied to the apparatus to be diagnosed is a single-phase alternating voltage, it is possible to consider a mode in which a plane is divided into, for example, a segment having a phase range of 0 to 179 degrees, and a segment having a phase range of 179 to 359 degrees.

In addition, if the alternating voltage applied to the apparatus to be diagnosed is a two-phase alternating voltage, it is possible to consider a mode in which a plane is divided into, for example, a segment having a phase range of 0 to 89 degrees, a segment having a phase range of 90 to 179 degrees, a segment having a phase range of 180 to 269 degrees, and a segment having a phase range of 270 to 359 degrees.

Moreover, if the alternating voltage applied to the apparatus to be diagnosed is a three-phase alternating voltage, it is possible to consider a mode in which a plane is divided into, for example, a segment having a phase range of 0 to 59 degrees, a segment having a phase range of 60 to 119 degrees, a segment having a phase range of 120 to 179 degrees, a segment having a phase range of 180 to 239 degrees, a segment having a phase range of 240 to 299 degrees, and a segment having a phase range of 300 to 359 degrees.

The above-described segment dividing mode is merely an example, and the segment dividing mode can be determined on the basis of characteristics of the alternating voltage.

In addition, the number of segments may be determined on the basis of a change in degradation pattern depending on a difference in degradation cause, for example, in a case where a degradation pattern that appears on the plane largely changes depending on a difference in degradation cause, the number of segments is decreased, or in a case where a degradation pattern that appears on the plane does not largely change depending on a difference in degradation cause, the number of segments is increased.

Incidentally, in a case where the measured signal of the sensor is a measured signal of partial discharge occurring inside a high voltage power apparatus, if a discharge pattern of partial discharge is a pattern that is sharp in a signal intensity direction, a bin value in a phase direction tends to become large in a histogram in a gradient direction.

If a discharge pattern of partial discharge is a pattern that is sharp in a phase direction, a bin value in a signal intensity direction tends to become large in the histogram in the gradient direction.

It is known that the discharge pattern of partial discharge differs depending on a degradation cause, and accordingly a position at which sets of a measured signal of a sensor and a phase signal are densely located changes, with the result that the discharge pattern forms a sharp shape in a signal intensity direction or in a phase direction. Therefore, comparing degradation patterns enables to determine a degradation cause.

Figure 8:
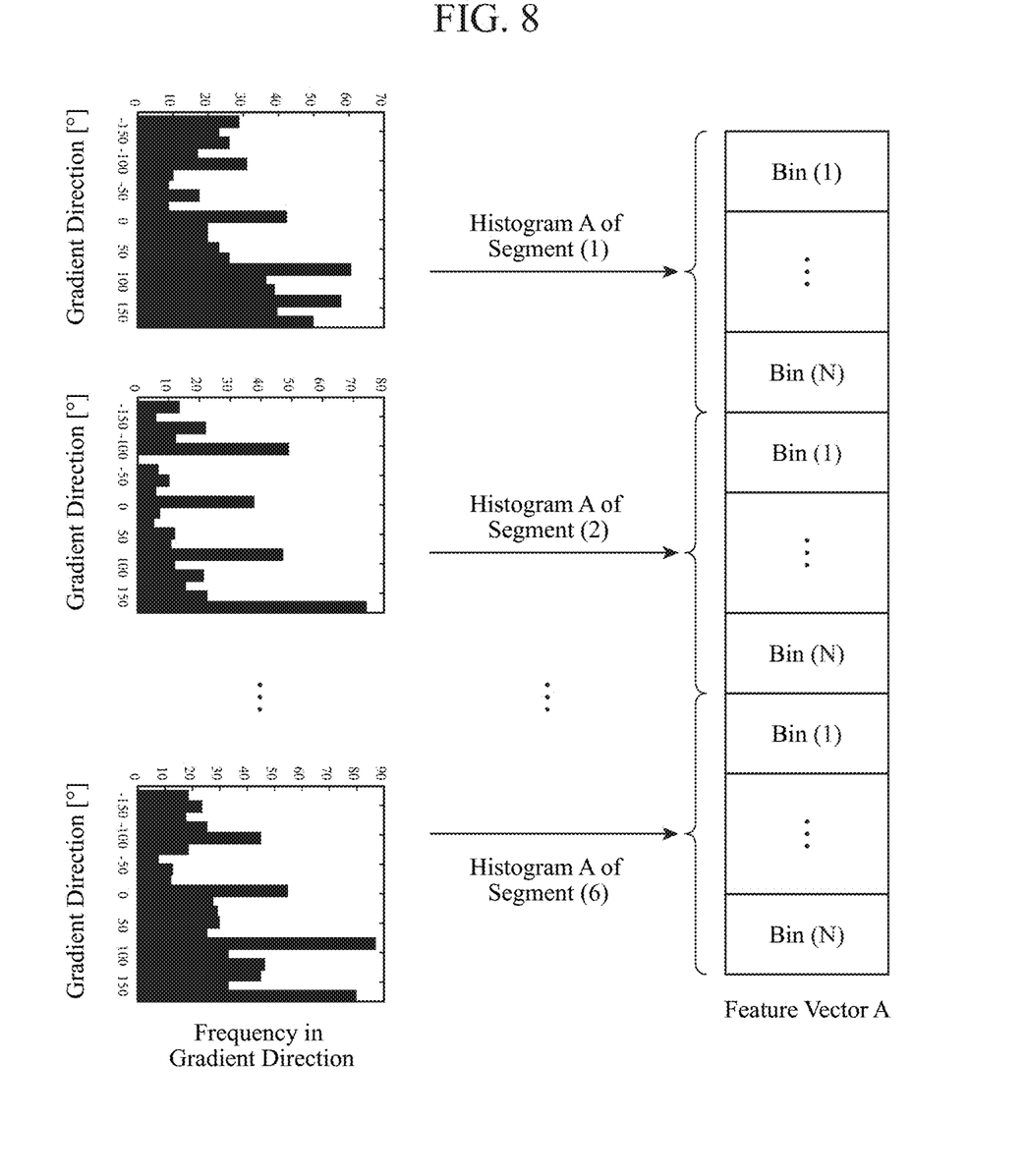
FIG. 8 is an explanatory drawing illustrating a feature vector A to be generated by a feature vector generation unit 5.

When the feature vector generation unit 5 receives, from the histogram calculation unit 4, the histogram A for each segment, as shown in FIG. 8, the feature vector generation unit 5 generates a feature vector A in which values of bins (1) to (N) of the histogram A for each segment are lined up in a row (step ST6 of FIG. 4).

FIG. 8 is an explanatory drawing illustrating the feature vector A generated by the feature vector generation unit 5.

The number of elements of the feature vector A is the number of segments×(the number of bins N of the histogram A), and for example, if the histogram A shows frequencies at intervals of 1 degree in a gradient direction of −180 to 180 degrees, the number of bins N of the histogram A is 360.

Therefore, in a case where the histograms A for six segments (1) to (6) are received from the histogram calculation unit 4, the feature vector A having 6×360 elements is generated.

Here, an example in which the number of bins N of the histogram A is 360 is shown. However, the number of bins N of the histogram A may be arbitrarily determined so long as the number of bins N of the histogram A is the same as the number of bins N of the undermentioned histogram B.

The feature vector generation unit 5 outputs the generated feature vector A to the degradation cause identification unit 9.

The above shows the example in which when the aging degradation diagnosis apparatus diagnoses a degradation state of an apparatus, phase signals obtained at the plurality of times, and measured signals obtained at the plurality of times, are given from the diagnostic signal input unit 1 to the degradation pattern generation unit 3, and consequently the degradation pattern generation unit 3 generates the degradation pattern A. Subsequently, the histogram calculation unit 4 calculates the histogram A, and the feature vector generation unit 5 generates the feature vector A.

Before the aging degradation diagnosis apparatus diagnoses a degradation state of the apparatus, phase signals at the plurality of times corresponding to the known degradation cause, and measured signals at the plurality of times corresponding to the known degradation cause, are input into the known signal input unit 2.

Subsequently, the phase signals at the plurality of times corresponding to the known degradation cause, and the measured signals at the plurality of times corresponding to the known degradation cause, are given from the known signal input unit 2 to the degradation pattern generation unit 3, and consequently the degradation pattern generation unit 3 generates the degradation pattern B.

A method for generating the degradation pattern B by the degradation pattern generation unit 3 is the same as the method for generating the degradation pattern A described above, and therefore detailed description thereof will be omitted. However, a degradation cause label indicating a degradation cause is added to the degradation pattern B generated by the degradation pattern generation unit 3.

The histogram calculation unit 4 calculates a gradient vector of the signal density at each distribution point in the degradation pattern B generated by the degradation pattern generation unit 3, and for each of segments that are phase ranges different from each other, calculates, from the calculated gradient vectors, a histogram B in the gradient direction of the signal densities in the segment.

A method for calculating the histogram B by the histogram calculation unit 4 is the same as the method for calculating the histogram A described above, and therefore detailed description thereof will be omitted. However, a degradation cause label indicating a degradation cause is added to the histogram B in each segment calculated by the histogram calculation unit 4.

The feature vector generation unit 5 generates the feature vector B in which bin values of the histogram B for each segment calculated by the histogram calculation unit 4 are lined up.

A method for generating the feature vector B by the feature vector generation unit 5 is the same as the method for generating the above-described feature vector A, and therefore detailed description thereof will be omitted. However, a degradation cause label indicating a degradation cause is added to the feature vector B generated by the feature vector generation unit 5.

As a feature vector, the degradation cause of which is known, the feature vector storage unit 6 stores the feature vector B generated by the feature vector generation unit 5.

The representative vector calculation unit 7 collects, from among the feature vectors B stored in the feature vector storage unit 6, a plurality of feature vectors B each having the same degradation cause.

In other words, since degradation cause labels are added to the feature vectors B stored in the feature vector storage unit 6, the representative vector calculation unit 7 collects, from among the feature vectors B stored in the feature vector storage unit 6, a plurality of feature vectors B to which the same degradation cause label is added.

From the plurality of feature vectors B to which the same degradation cause label is added, the representative vector calculation unit 7 calculates a representative vector of the degradation cause indicated by the degradation cause label.

For example, the representative vector calculation unit 7 calculates an average value of bin values of respective bins that are corresponding elements in the plurality of feature vectors B to which the same degradation cause label is added, and calculates, as a representative vector of the degradation cause, a feature vector having the calculated average values as respective element values.

If the number of kinds of degradation cause labels of the feature vector B stored in the feature vector storage unit 6 is M, the number of degradation causes is M, and therefore the representative vector calculation unit 7 calculates a representative vector for each of the degradation causes, the number of which is M.

The representative vector storage unit 8 stores the feature vectors calculated by the representative vector calculation unit 7 as feature vectors C by degradation cause.

When the feature vector A output from the feature vector generation unit 5 is received, the degradation cause identification unit 9 searches for a feature vector C similar to the feature vector A from among the feature vectors C by degradation cause stored in the representative vector storage unit 8, and identifies a degradation cause of the apparatus (step ST7 of FIG. 4).

A process of identifying a degradation cause by the degradation cause identification unit 9 will be specifically described below.

The degradation cause identification unit 9 calculates similarity between the feature vector A output from the feature vector generation unit 5 and each of the feature vectors C by degradation cause stored in the representative vector storage unit 8.

For example, as the similarity between the feature vector A and each of the feature vectors C, the degradation cause identification unit 9 calculates an absolute value of a correlation coefficient between the feature vector A and each of the feature vectors C. The absolute value of the correlation coefficient increases with the increase in similarity. With respect to a process of calculating an absolute value of a correlation coefficient, the calculation processing itself is a publicly known technology, and therefore detailed description thereof will be omitted.

When the similarity between the feature vector A and each of the feature vectors C by degradation cause is calculated, the degradation cause identification unit 9 compares the calculated similarities, and identifies the feature vector C having the highest similarity to the feature vector A from among the feature vectors C by degradation cause.

As a result of identifying a degradation cause of the apparatus, the degradation cause identification unit 9 outputs a degradation cause label added to the identified feature vector C.

Here, an example in which the degradation cause identification unit 9 outputs a degradation cause label added to the feature vector C having the highest similarity to the feature vector A is shown. However, in a case where the highest similarity does not reach a preset threshold value, the degradation cause identification unit 9 may be adapted not to output the degradation cause label added to the identified feature vector C.

In addition, in a case where there is a plurality of similarities that are higher than or equal to the threshold value among the calculated similarities, the degradation cause identification unit 9 may output respective degradation cause labels added to the plurality of feature vectors C having similarities higher than or equal to the threshold value.

Here, an example in which as a result of identifying a degradation cause of the apparatus, the degradation cause identification unit 9 outputs the degradation cause label added to the identified feature vector C is shown.

The degradation cause identification unit 9 may output not only the degradation cause label, but also, for example, the degradation pattern A corresponding to the feature vector A output from the feature vector generation unit 5, and the degradation pattern B corresponding to the identified feature vector C.

As clearly understood from the above, according to the first embodiment, there are provided: a degradation pattern generation unit 3 that generates a degradation pattern indicating distributions of signal intensities of measured signals and phases of alternating voltage; a histogram calculation unit 4 that calculates a gradient vector of the signal density at each distribution point in the degradation pattern, and for each of phase ranges different from each other, calculates, from the calculated gradient vectors, a histogram in the gradient direction of the signal densities within the phase range; and a feature vector generation unit 5 that generates a feature vector in which bin values of the histograms in the respective phase ranges are lined up. In addition, from among the feature vectors by degradation cause, the degradation cause identification unit 9 searches for a feature vector similar to the feature vector generated by the feature vector generation unit 5, and identifies a degradation cause of the apparatus.

This produces an effect to identify a degradation cause of the apparatus without preparing beforehand a neural network that learns a degradation cause determination model.

Second Embodiment

The first embodiment described above shows an example in which when the aging degradation diagnosis apparatus diagnoses a degradation state of the apparatus, phase signals obtained at the plurality of times, and measured signals obtained at the plurality of times are given from the diagnostic signal input unit 1 to the degradation pattern generation unit 3.

The second embodiment shows an example in which whether or not degradation is occurring in an apparatus is determined from a measured signal of a sensor, and only in a case where it is determined that degradation is occurring, a measured signal of a sensor, and a phase signal obtained at the same measurement time as that of the measured signal are given to the degradation pattern generation unit 3.

Figure 9:
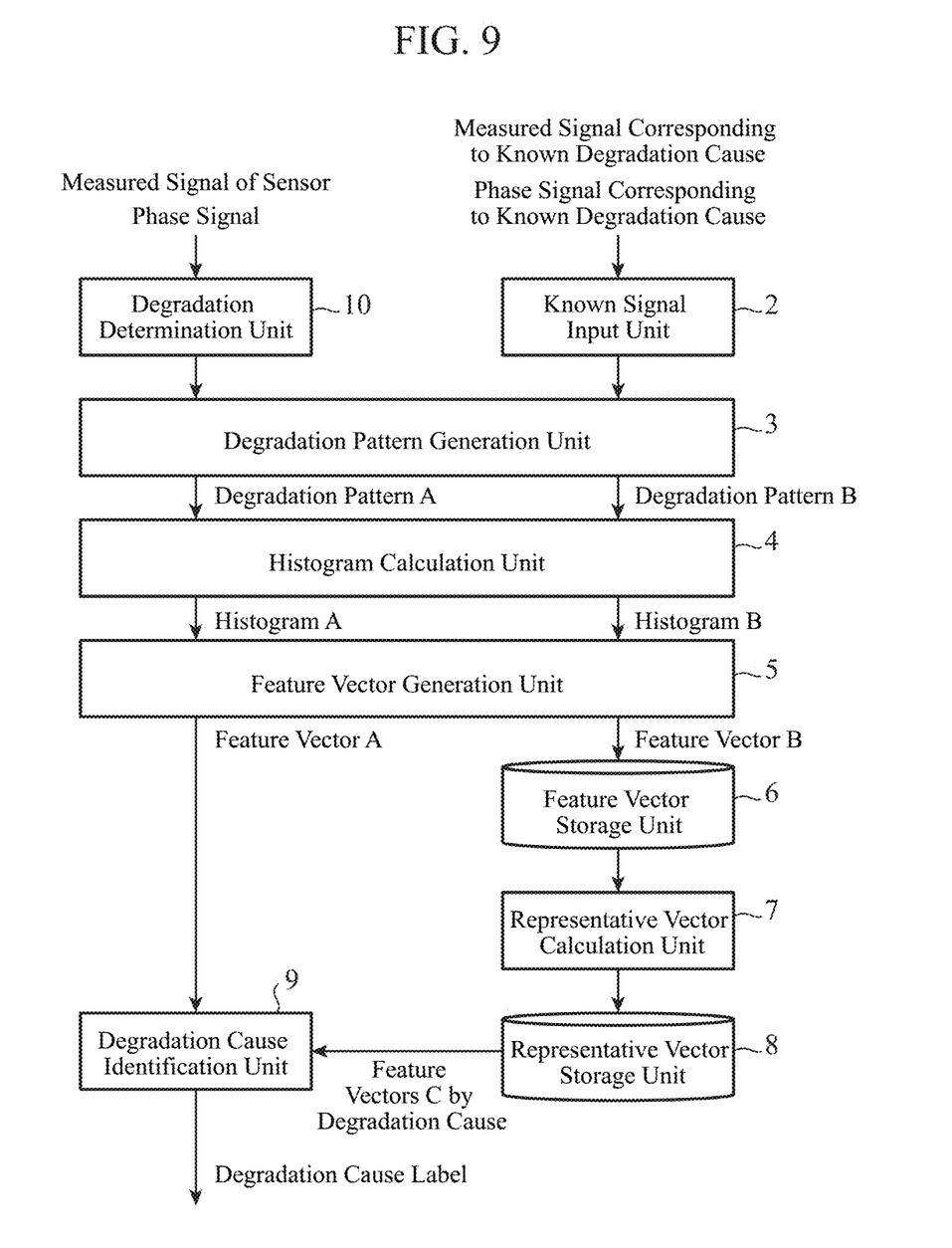
FIG. 9 is a configuration diagram illustrating an aging degradation diagnosis apparatus according to a second embodiment of the present invention.
Figure 10:
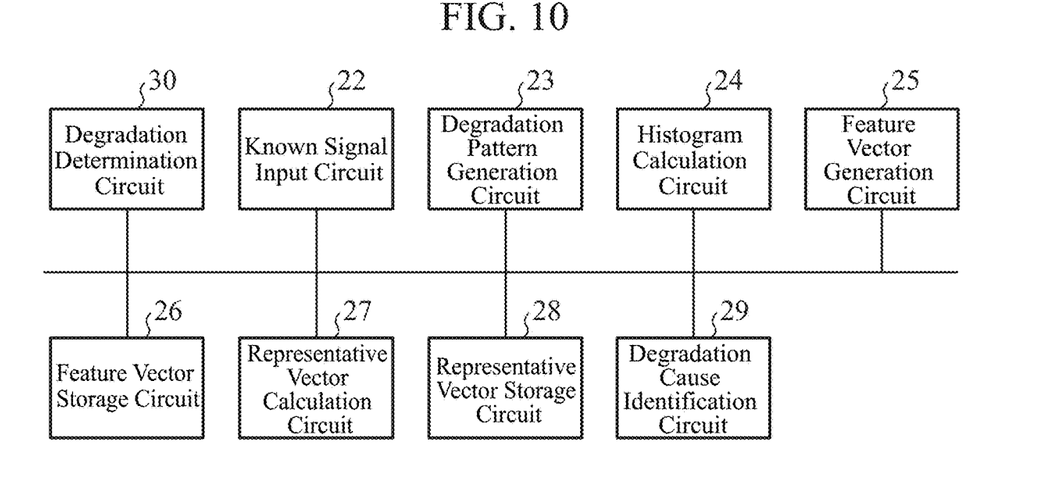
FIG. 10 is a hardware configuration diagram illustrating the aging degradation diagnosis apparatus according to the second embodiment of the present invention.

FIG. 9 is a configuration diagram illustrating an aging degradation diagnosis apparatus according to the second embodiment of the present invention. FIG. 10 is a hardware configuration diagram illustrating the aging degradation diagnosis apparatus according to the second embodiment of the present invention.

In FIGS. 9 and 10, reference numerals the same as those of FIGS. 1 and 2 denote identical or equivalent components, and therefore the explanation thereof will be omitted.

A degradation determination unit 10 is implemented by a degradation determination circuit 30 shown in, for example, FIG. 10.

The degradation determination unit 10 performs a process of determining, from a measured signal of a sensor that is measuring a degradation state of an apparatus, whether or not degradation is occurring in an apparatus.

Only in a case where it is determined that degradation is occurring, the degradation determination unit 10 performs a process of outputting a measured signal of the sensor, and a phase signal obtained at the same measurement time as that of the measured signal, to the degradation pattern generation unit 3.

In FIG. 9, it is assumed that the known signal input unit 2, the degradation pattern generation unit 3, the histogram calculation unit 4, the feature vector generation unit 5, the feature vector storage unit 6, the representative vector calculation unit 7, the representative vector storage unit 8, the degradation cause identification unit 9 and the degradation determination unit 10, which are components of the aging degradation diagnosis apparatus, are each implemented by dedicated hardware such as that shown in FIG. 10. In other words, it is assumed that the components of the aging degradation diagnosis apparatus are implemented by the known signal input circuit 22, the degradation pattern generation circuit 23, the histogram calculation circuit 24, the feature vector generation circuit 25, the feature vector storage circuit 26, the representative vector calculation circuit 27, the representative vector storage circuit 28, the degradation cause identification circuit 29 and the degradation determination circuit 30.

For example, a single circuit, a composite circuit, a programmed processor, a parallel-programmed processor, an ASIC, an FPGA, or a combination of these components, is applicable to the known signal input circuit 22, the degradation pattern generation circuit 23, the histogram calculation circuit 24, the feature vector generation circuit 25, the representative vector calculation circuit 27, the degradation cause identification circuit 29 and the degradation determination circuit 30.

The components of the aging degradation diagnosis apparatus are not limited to those implemented by dedicated hardware. The aging degradation diagnosis apparatus may be implemented by software, firmware or a combination of software and firmware.

In a case where the aging degradation diagnosis apparatus is implemented by software, firmware or the like, the feature vector storage unit 6 and the representative vector storage unit 8 are formed on the memory 41 of the computer shown in FIG. 3, a program that causes the computer to execute processing procedures of the known signal input unit 2, the degradation pattern generation unit 3, the histogram calculation unit 4, the feature vector generation unit 5, the representative vector calculation unit 7, the degradation cause identification unit 9 and the degradation determination unit 10 is stored in the memory 41, and the processor 42 of the computer has only to be caused to execute the program stored in the memory 41.

Next, operation will be described.

Processing contents other than those of the degradation determination unit 10 are similar to those in the first embodiment described above, and therefore only the processing contents of the degradation determination unit 10 will be described here.

Figure 11:
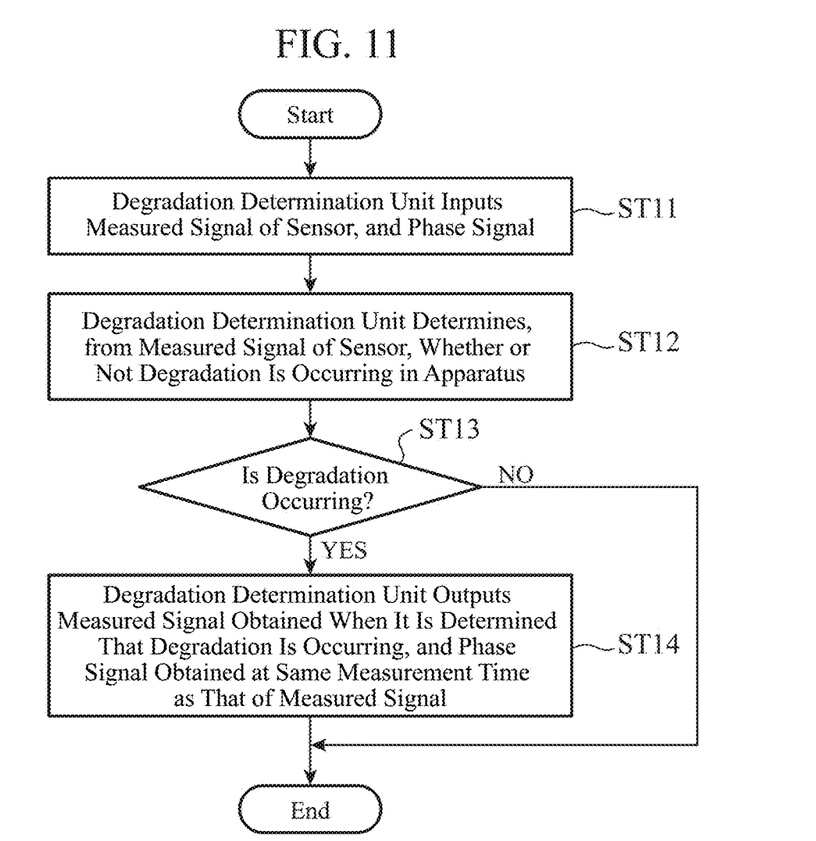
FIG. 11 is a flowchart illustrating processing contents in a degradation determination unit 10 of the aging degradation diagnosis apparatus according to the second embodiment of the present invention.

FIG. 11 is a flowchart illustrating processing contents in the degradation determination unit 10 of the aging degradation diagnosis apparatus according to the second embodiment of the present invention.

In the first embodiment described above, the measured signal of the sensor is given to the degradation pattern generation unit 3 without being distinguished whether the measured signal is a signal measured in a state in which the apparatus has already been degraded or a signal measured when the apparatus is in a normal state.

In a case where the measured signal of the sensor is a signal measured when the apparatus is in a normal state, a degradation cause label is not output from the degradation cause identification unit 9.

However, it is not possible to know whether the reason why the degradation cause label is not output from the degradation cause identification unit 9 is because the apparatus is in a normal state or because the degradation cause of the apparatus is not a known degradation cause. Therefore, there is a case where a user is troubled with handling of the apparatus.

In addition, if the apparatus is in a normal state, it is not necessary to carry out a determination process of determining a degradation cause, and therefore processes of the degradation pattern generation unit 3, the histogram calculation unit 4, the feature vector generation unit 5 and the degradation cause identification unit 9 becomes useless.

Accordingly, in the second embodiment, if the measured signal of the sensor is a signal measured when the apparatus is in a normal state, the measured signal is not given to the degradation pattern generation unit 3 so as to omit useless processing in the degradation pattern generation unit 3, the histogram calculation unit 4, the feature vector generation unit 5 and the degradation cause identification unit 9.

In addition, because the apparatus is in a normal state is excluded from reasons why a degradation cause label is not output from the degradation cause identification unit 9.

When degradation of an apparatus is diagnosed, the degradation determination unit 10 receives measured signals obtained at the plurality of times, the measured signals measured at fixed time intervals T by the sensor (step ST11 of FIG. 11).

In addition, the degradation determination unit 10 receives phase signals obtained at the plurality of times, the phase signals indicating phases of the alternating voltage applied to the apparatus to be diagnosed (step ST11 of FIG. 11).

The degradation determination unit 10 determines, from the input measured signal of the sensor, whether or not degradation is occurring in the apparatus (step ST12 of FIG. 11).

A determination process of determining, by the degradation determination unit 10, whether or not degradation is occurring will be specifically described below.

For example, in a case where the measured signal of the sensor tends to increase with the progress of the degradation of the apparatus, the degradation determination unit 10 compares the measured signal of the sensor with a preset degradation-state-determination threshold value.

If the measured signal of the sensor is higher than or equal to the threshold value, the degradation determination unit 10 determines that degradation of the apparatus is occurring.

If the measured signal of the sensor is lower than the threshold value, the degradation determination unit 10 determines that degradation of the apparatus is not occurring.

For example, in a case where an apparatus to be diagnosed is a high voltage power apparatus, a progress degree of degradation of the apparatus is in a proportional relationship with the intensity of partial discharge. Therefore, if the measured signal of the sensor is a signal that is measuring the intensity of partial discharge, it is assumed that a signal value of the measured signal of the sensor becomes larger with the progress of the degradation of the apparatus.

In addition, the intensity of partial discharge also changes due to a change in temperature of the apparatus or the occurrence of vibrations, and therefore the degradation determination unit 10 may be adapted to model, beforehand, the relationship between the intensity of partial discharge and the temperature or the vibrations.

In this case, the degradation determination unit 10 may subject the measured signal of the sensor to temperature correction or vibration correction by using the model, and if the measured signal after the correction is higher than or equal to the threshold value, the degradation determination unit 10 may determine that degradation of the apparatus is occurring.

Moreover, the progress degree of degradation of the apparatus is in a proportional relationship with the number of occurrences of partial discharge. Therefore, the sensor counts the number of occurrences of partial discharge as a measured signal, and subsequently the degradation determination unit 10 may determine the progress degree of degradation from the number of occurrences of partial discharge within a fixed period of time.

Here, an example in which the degradation determination unit 10 compares the measured signal of the sensor with the threshold value to determine whether or not degradation is occurring is shown. However, for example, a determination may be made as described below.

The degradation determination unit 10 builds a model for estimating measured signals at the normal time of the apparatus by carrying out, for example, machine learning using design knowledge, physical laws or apparatus data at the normal time.

If a difference between the measured signal at the normal time of the apparatus estimated by the model and the measured signal of the sensor is larger than or equal to the threshold value, the degradation determination unit 10 determines that degradation of the apparatus is occurring, and if the difference is smaller than the threshold value, the degradation determination unit 10 determines that degradation of the apparatus is not occurring.

If it is determined that degradation is occurring (step ST13 of FIG. 11: in the case of YES), the degradation determination unit 10 compares a time stamp added to the measured signal of the sensor with a time stamp added to the input phase signal.

The time stamp added to the measured signal of the sensor indicates the measurement time of the measured signal, and the time stamp added to the phase signal indicates the measurement time of the phase signal.

The degradation determination unit 10 refers to a result of comparing the time stamps, and identifies, from among input phase signals at the plurality of times, a phase signal obtained at the same measurement time as that of the measured signal obtained when it is determined that degradation is occurring.

The degradation determination unit 10 outputs a set of the measured signal obtained when it is determined that degradation is occurring and the identified phase signal to the degradation pattern generation unit 3 (step ST14 of FIG. 11).

If it is determined that degradation is not occurring (step ST13 of FIG. 11: in the case of NO), the degradation determination unit 10 does not output, to the degradation pattern generation unit 3, the measured signal obtained when it is determined that degradation is not occurring.

In a case where it is determined that degradation is not occurring, the degradation determination unit 10 may output a determination result indicating that degradation is not occurring.

As clearly understood from the above, according to the second embodiment, the aging degradation diagnosis apparatus is provided with the degradation determination unit 10 that determines, from a measured signal of a sensor for measuring a degradation state of an apparatus, whether or not degradation is occurring in the apparatus, and that, only in a case where it is determined that degradation is occurring, outputs a measured signal, and a phase signal obtained at the same measurement time as that of the measured signal, to the degradation pattern generation unit 3. Therefore, the determination process of determining a degradation cause at the normal time at which it is not necessary to identify a degradation cause can be omitted.

In addition, when a degradation cause label is not output from the degradation cause identification unit 9, because the apparatus is in a normal state can be excluded from reasons why no degradation cause label is output.

It should be noted that a free combination of embodiments, or a modification of any component of each embodiment, or an omission of any component in each embodiment can be made in the invention of the present application within the scope of the present invention.

INDUSTRIAL APPLICABILITY

The present invention is suitable for an aging degradation diagnosis apparatus and an aging degradation diagnosis method, each of which outputs a degradation cause of an apparatus.

REFERENCE SIGNS LIST

1: Diagnostic signal input unit,
2: Known signal input unit,
3: Degradation pattern generation unit,
4: Histogram calculation unit,
5: Feature vector generation unit,
6: Feature vector storage unit,
7: Representative vector calculation unit,
8: Representative vector storage unit,
9: Degradation cause identification unit,
10: Degradation determination unit,
21: Diagnostic signal input circuit,
22: Known signal input circuit,
23: Degradation pattern generation circuit,
24: Histogram calculation circuit,
25: Feature vector generation circuit,
26: Feature vector storage circuit,
27: Representative vector calculation circuit,
28: Representative vector storage circuit,
29: Degradation cause identification circuit,
30: Degradation determination circuit,
41: Memory, and
42: Processor.

The invention claimed is:

1. An aging degradation diagnosis apparatus comprising: processing circuitry,
to generate, from phase signals obtained at a plurality of times, the phase signals indicating a phase of an alternating voltage applied to an apparatus to be diagnosed, and from measured signals measured at a plurality of times by a sensor that is measuring a degradation state of the apparatus, a degradation pattern indicating a distribution of signal intensities of the measured signals and the phase of the alternating voltage;
to calculate a gradient vector of a signal density at each of distribution points of the degradation pattern, and calculate, for each of phase ranges different from each other, from the calculated gradient vector, a histogram in a gradient direction of the signal density within the relevant phase range;
to generate a feature vector in which bin values of the histogram for each of the phase ranges are lined up; and
to search for, from among feature vectors by degradation cause, a feature vector similar to the feature vector, and identify a degradation cause of the apparatus.

2. The aging degradation diagnosis apparatus according to claim 1, wherein
the processing circuitry divides a plane in which a first axis thereof is a phase of an alternating voltage, and a second axis thereof is a signal intensity of a measured signal, into a plurality of blocks, and generates, as the degradation pattern, a pattern indicating the number of sets of the phase signal and the measured signal that belong to each divided block.

3. The aging degradation diagnosis apparatus according to claim 2, wherein
from the number of sets of the phase signal and the measured signal that belong to each block, indicated by the degradation pattern, the processing circuitry calculates a gradient vector of a signal density at a distribution point of each block.

4. The aging degradation diagnosis apparatus according to claim 1, wherein the processing circuitry
stores feature vectors in which a degradation cause is known;
collects a plurality of feature vectors that are the same in degradation cause as each other, from among the feature vectors, and calculating a representative vector of the degradation cause from the collected feature vectors; and
stores, as the feature vector by degradation cause, the representative vector.

5. The aging degradation diagnosis apparatus according to claim 1, wherein
the processing circuitry calculates similarities between the feature vectors by degradation cause and the feature vector, compares the calculated similarities, and from among the feature vectors by degradation cause, searches for a feature vector similar to the feature vector.

6. The aging degradation diagnosis apparatus according to claim 1, wherein
the processing circuitry determines, from the measured signals of the sensor that is measuring the degradation state of the apparatus, whether or not degradation is occurring in the apparatus.

7. An aging degradation diagnosis method comprising:
from phase signals obtained at a plurality of times, the phase signals indicating a phase of an alternating voltage applied to an apparatus to be diagnosed, and from measured signals measured at a plurality of times by a sensor that is measuring a degradation state of the apparatus, generating a degradation pattern indicating a distribution of signal intensities of the measured signals and the phase of the alternating voltage;
calculating a gradient vector of a signal density at each of distribution points of the degradation pattern, and for each of phase ranges different from each other, calculating, from the calculated gradient, vector, a histogram in a gradient direction of the signal densities within the phase range;
generating a feature vector in which bin values of the histogram for each of the phase ranges are lined up; and
searching for, from among feature vectors by degradation cause; a feature vector similar to the feature vector, and identifying a degradation cause of the apparatus.

\* \* \* \* \*